(12) United States Patent
Lu et al.

(10) Patent No.: US 10,871,256 B2
(45) Date of Patent: Dec. 22, 2020

(54) PROPERTY ENHANCEMENT OF SURFACES BY ELECTROLYTIC MICRO ARC OXIDATION

(71) Applicant: SCHLUMBERGER TECHNOLOGY CORPORATION, Sugar Land, TX (US)

(72) Inventors: You Lu, Sugar Land, TX (US); Manuel P. Marya, Rosharon, TX (US); Virendra Singh, Stafford, TX (US); Tatiana Reyes Ayers, Rosenberg, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 248 days.

(21) Appl. No.: 14/810,155

(22) Filed: Jul. 27, 2015

(65) Prior Publication Data
US 2017/0029959 A1    Feb. 2, 2017

(51) Int. Cl.
*B32B 15/04*    (2006.01)
*F16L 58/08*    (2006.01)
(Continued)

(52) U.S. Cl.
CPC .............. *F16L 58/08* (2013.01); *C23C 16/06* (2013.01); *C23C 16/56* (2013.01); *C23C 28/32* (2013.01); *C23C 28/321* (2013.01); *C23C 28/322* (2013.01); *C23C 28/345* (2013.01); *C25D 5/48* (2013.01); *C25D 7/04* (2013.01);
(Continued)

(58) Field of Classification Search
None
See application file for complete search history.

(56) References Cited

U.S. PATENT DOCUMENTS 2,897,125 A    7/1958 Franklin
3,367,794 A    2/1968 Burnett
(Continued)

FOREIGN PATENT DOCUMENTS

CA    2540340 C    4/2009
CN    101660190 B    12/2010
(Continued)

OTHER PUBLICATIONS

Tian et al., "The improved corrosion resistance of anodic films on aluminum by nickel ions implantation", Aug. 2006, Surface & Coatings Technology, vol. 201, pp. 3246-3252.*
(Continued)

*Primary Examiner* — Seth Dumbris (57) ABSTRACT

Embodiments of the present technology may include a tubular product for oilfield applications. The tubular product may include a tubular substrate, which may include a ferrous alloy. The tubular substrate may have an inner surface characterized by an inner diameter and an outer surface characterized by an outer diameter. The tubular product may also include a first layer deposited over at least one of the inner surface or the outer surface. The first layer may include aluminum. The tubular product may further include a second layer, which may include aluminum oxide formed by micro arc oxidation of a portion of the first layer.

19 Claims, 5 Drawing Sheets

(51) Int. Cl.

| | |
|---|---|
| *C23C 16/56* | (2006.01) |
| *C23C 16/06* | (2006.01) |
| *C23C 28/00* | (2006.01) |
| *C25D 5/48* | (2006.01) |
| *C25D 7/04* | (2006.01) |
| *C25D 11/06* | (2006.01) |
| *C25D 11/02* | (2006.01) |
| *C25D 11/30* | (2006.01) |
| *C25D 11/26* | (2006.01) |
| *C25D 11/24* | (2006.01) |
| *C25D 11/04* | (2006.01) |
| *E21B 17/10* | (2006.01) |

(52) U.S. Cl.
CPC .......... *C25D 11/022* (2013.01); *C25D 11/024* (2013.01); *C25D 11/026* (2013.01); *C25D 11/04* (2013.01); *C25D 11/06* (2013.01); *C25D 11/246* (2013.01); *C25D 11/26* (2013.01); *C25D 11/30* (2013.01); *E21B 17/1085* (2013.01)

(56) References Cited

U.S. PATENT DOCUMENTS

| | | | | |
|---|---|---|---|---|
| 4,350,719 A * | 9/1982 | Baldi | ............... | C23C 10/02 427/253 |
| 5,265,129 A * | 11/1993 | Brooks | ............... | G21C 17/017 376/245 |
| 6,197,178 B1 * | 3/2001 | Patel | ............... | C25D 11/04 204/230.2 |
| 6,219,482 B1 * | 4/2001 | Matsuzaki | ............... | G02B 6/4423 385/100 |
| 6,264,817 B1 | 7/2001 | Timoshenko et al. | | |
| 6,893,551 B2 | 5/2005 | Krishna et al. | | |
| 8,163,156 B2 | 4/2012 | Mamaev et al. | | |
| 8,334,017 B2 * | 12/2012 | Pushparaj | ............... | B82Y 10/00 427/248.1 |
| 8,486,237 B2 | 7/2013 | Krishna et al. | | |
| 8,663,401 B2 | 3/2014 | Marya et al. | | |
| 2001/0019778 A1 | 9/2001 | Gardaz et al. | | |
| 2008/0086195 A1 | 4/2008 | Atanasoka et al. | | |
| 2008/0283410 A1 | 11/2008 | Nikiforov | | |
| 2009/0223829 A1 | 9/2009 | Gao et al. | | |
| 2009/0252986 A1 * | 10/2009 | Owen | ............... | C23C 4/02 428/623 |
| 2009/0317656 A1 | 12/2009 | Dai et al. | | |
| 2010/0040795 A1 | 2/2010 | Dai et al. | | |
| 2010/0108647 A1 * | 5/2010 | Teraoka | ............... | B23K 3/03 219/85.1 |
| 2011/0177358 A1 * | 7/2011 | Horton | ............... | C22C 1/02 428/640 |
| 2011/0303547 A1 | 12/2011 | Ostrovsky | | |
| 2012/0031765 A1 | 2/2012 | Curran et al. | | |
| 2012/0152409 A1 | 6/2012 | Sachdeva et al. | | |
| 2012/0189778 A1 | 7/2012 | Riewe et al. | | |
| 2012/0305402 A1 | 12/2012 | Krishna et al. | | |
| 2013/0008687 A1 * | 1/2013 | Lu | ............... | H01B 7/2806 174/119 C |
| 2014/0126130 A1 | 5/2014 | Aurognzeb | | |

FOREIGN PATENT DOCUMENTS

| | | | |
|---|---|---|---|
| CN | 102513913 A | | 6/2012 |
| CN | 102877104 A | | 1/2013 |
| CN | 103372232 A | | 10/2013 |
| CN | 103526258 A | | 1/2014 |
| CN | 103590088 A | | 2/2014 |
| CN | 103643278 A | | 3/2014 |
| GB | 1397395 | * | 6/1975 |

OTHER PUBLICATIONS

Curran, J. A. et al, "The Thermal Conductivity of Plasma Electrolytic Oxide Coatings on Aluminium and Magnesium," Surface & Coatings Technology, 2005, 199, pp. 177-183.

Hornberger, H. et al., "Biomedical Coatings on Magnesium Alloys—A Review", Acta Biomaterialia, 2012, 8, pp. 2442-2455.

Hussein, R.O. et al., "Production of Anti-Corrosion Coatings on Light Alloys (Al, Mg, Ti) by Plasma-Electrolytic Oxidation (PEO)", Developments in Corrosion Protection, Dr. M. Aliofkhazraei (Ed.), ISBN: 978-953-51-1223-5, InTech, DOI: 10.5772/57171, 40 pages.

Krishna, L. R. et al., "A Comparative Study of Tribological Behaviour of Microarc Oxidation and Hard Anodised Coatings", Wear 261, 2006, pp. 1095-1101.

Krishna, L. R. et al., "Aqueous Corrosion Behavior of Micro Arc Oxidation (MAO)-Coated Magnesium Alloys: A Critical Review", JOM, 2014, 66(6), pp. 1045-1060.

Li, Q-B. et al., "Plasma Electrolytic Oxidation Coatings on Lightweight Metals, Modern Surface Engineering Treatments", Dr. M. Aliofkhazraei (Ed.), ISBN: 978-953-51-1149-8, InTech, DOI: 10.5772/55688, 27 pages.

Malaczynski, G. W. et al., "Diamond-Like Carbon Coating for Aluminum 390 Alloy—Automotive Applications", Surface and Coatings Technology, 1997, 93(2-3), pp. 280-286.

Malyshev, V. N. et al., "Tribological Characteristics Improvement of Wear Resistant MAO-Coatings", Journal of Coatings, 2013, vol. 2013, 5 pages.

O'Meara, M. et al., "Deposition of Aluminum Using Ionic Liquids. BASF Process Improves Adhesion and Coating Density", Metal Finishing, 2009, 107 (7-8), pp. 38-39.

Shrestha, S. et al., "Plasma Electrolytic Oxidation and Anodising of Aluminium Alloys for Spacecraft Applications", Surface Engineering of Light Alloys, Woodhead Publishing, Limited, 2010, pp. 603-641.

Voevodin, A. A. et al., "Characterization of Wear Protective Al—Si—O Coatings Formed on Al-Based Alloys by Micro-Arc Discharge Treatment", Surface and Coatings Technology, 1996, 86-87, pp. 516-521.

Wasekar, N. P. et al., "Effect of Micro Arc Oxidation Coatings on Corrosion Resistance of 6061-Al Alloy", Journal of Materials Engineering and Performance, 2008, 17(5), pp. 708-713.

Yerokhin, A. L. et al., "Spatial Characteristics of Discharge Phenomena in Plasma Electrolytic Oxidation of Aluminium Alloy", Surface and Coatings Technology, 2004, 177-178, pp. 779-783.

* cited by examiner

PROPERTY ENHANCEMENT OF SURFACES BY ELECTROLYTIC MICRO ARC OXIDATION

BACKGROUND

Embodiments of the present technology relate to preventing corrosion, erosion, and/or wear of surfaces of products involved in the transport, exploration, and/or production of hydrocarbons, including petroleum.

Parts used in the oilfield business are subjected to less than ideal conditions. These parts may be exposed to a variety of corrosive fluids and may be subjected to harsh temperature, pressure, or other environmental conditions. Additionally, some oilfield parts may be forced deep into the earth and may be contacted with rocks or other hard material. Oilfield parts may need both mechanical strength and resistance to corrosion, among other properties. As a result of various conditions, the oilfield parts may corrode, deform, fracture, or become unusable. Stronger and/or more corrosion resistant oilfield parts are desired. These and other improvements are addressed herein.

BRIEF SUMMARY

Embodiments of the present technology may improve on the mechanical and/or surface properties of a substrate, such as a ferrous alloy. The longevity or survivability of equipment in oilfields and/or exposed to oilfield environments may be improved. Additional layers or coatings may be deposited onto the substrate to provide resistance against corrosion, wear, and other degradation. The additional layers may include different metals or compounds than the substrate and may possess different mechanical, thermal, and/or electrical properties than the substrate. The metals or compounds may form oxide layers on the surface, potentially adding an additional protective layer over the substrate. Embodiments of the present technology may be scalable and adaptable for substrates from those that are on the order of one foot in size to substrates that may be on the order of 25 feet or more in size. Embodiments may also allow deposition of layers on the inner and/or outer surfaces of a tubular or annular substrates. Furthermore, materials may be embedded in layers or added on top of deposited layers to add functionality or enhance properties of the layers or substrate. Some embodiments may include processing substrates and other materials for use in oilfield applications. Methods and products may be more economically efficient than conventional methods and products.

Embodiments of the present technology may include a method of improving tribological and corrosion properties of an oilfield tubular for conveying hydrocarbons. The method may include depositing a first layer comprising aluminum over a substrate. The substrate may include ferrous alloys, including steels or steel alloys. The method may also include immersing the substrate and the first layer in an alkaline electrolytic liquid bath. The method may further include oxidizing a first portion of the first layer by micro arc oxidation to form a second layer over a second portion of the first layer. The second layer may include aluminum oxide. The oilfield tubular may include the substrate, the first layer, and the second layer.

Some embodiments may include a tubular product for oilfield applications. The tubular product may include a tubular substrate. The tubular substrate may include a ferrous alloy, including steel or steel alloy. The tubular substrate may have an inner surface characterized by an inner diameter and an outer surface characterized by an outer diameter. The tubular product may also include a first layer deposited over at least one of the inner surface or the outer surface. The first layer may include aluminum. The tubular product may further include a second layer, which may include aluminum oxide formed by micro arc oxidation of a portion of the first layer.

Embodiments may include a method of making a product for oilfield applications. The method may include depositing a first layer over a substrate. The substrate may include a first material. The first material may include a ferrous alloy, nickel alloy, or copper alloy. The first layer may include a second material. The second material may include aluminum, magnesium, titanium, or a composite metal or an alloy that includes aluminum and magnesium. The method may further include oxidizing a first portion of the first layer by micro arc oxidation to form a second layer over a second portion of the first layer. The second layer may include an oxide of the second material.

DETAILED DESCRIPTION

Conventional parts used in the oilfield business may not include deposition of layers onto ferrous alloy substrates. Light metals, which commonly include aluminum, magnesium, titanium, and their alloys, are limited in oilfield applications partly as a result of their insufficient strength in load bearing applications, oilfield fluid corrosion (e.g., titanium in acids), and wear properties (e.g., galling characteristics). While these light metals and alloys may form protective oxide layers, these layers may be less than a micron thick. As a result, the oxide layers and the metal or alloy may provide poor wear and abrasion resistance.

Embodiments of the present technology may overcome some of the shortcomings of conventional methods and systems. Embodiments may form a thicker and/or denser protective oxide layer to enhance wear and abrasion resistance. Additionally, metals, alloys, and/or composites may be selected or tailored to provide advantageous properties in the finished product. What is more, particles or additives may be embedded in the oxide layer and/or underlying layers in order to further enhance properties or add functionality to the finished product. The deposited layers and/or oxide layer may have a structure or morphology that may be impregnated with an overlay coating or additive to improve the properties or functionality of the finished product.

Embodiments of the present technology may include a method of improving tribological and corrosion properties of an oilfield tubular for conveying hydrocarbons. Oilfield tubulars may include an oilfield pipe. An oilfield pipe may include a drill pipe, drill collar, pup joint, casing, production tubing, and pipeline.

Drill pipe may connect a rig surface equipment with the bottomhole assembly and the bit. The drill pipe may facilitate pumping of drilling fluid to the bit and be able to raise lower, and rotate the bottomhole assembly and the bit. The drill pipe may be part of a drillstring.

Figure 1:
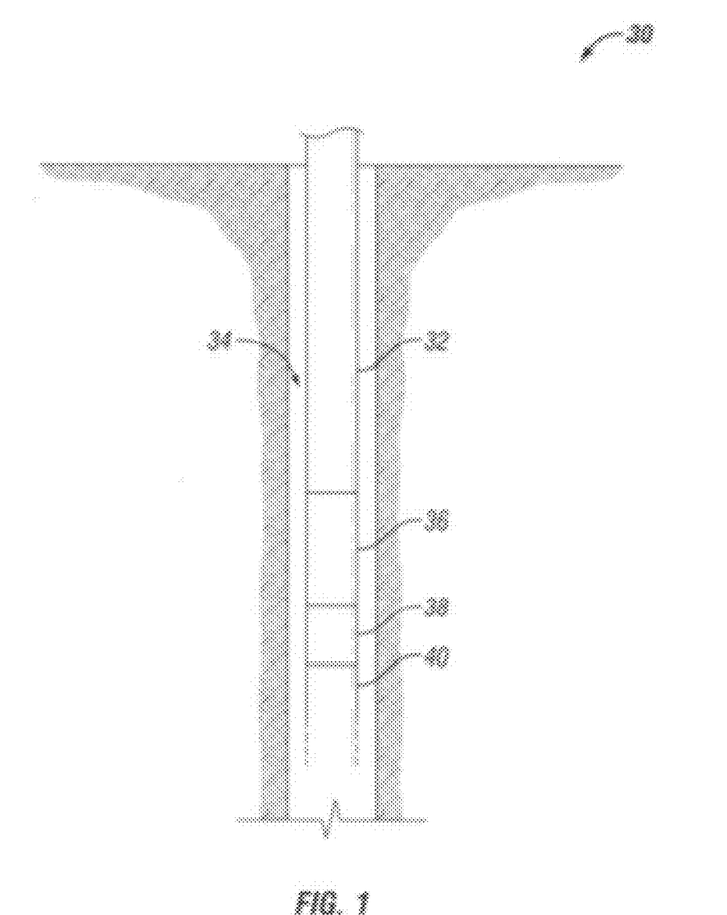
FIG. 1 shows an embodiment of a drillstring of a drilling rig.

Referring to FIG. 1, illustrated is a drillstring 30 of a drilling rig. The drillstring 30 is positioned downhole within a well or borehole 34. The drillstring 30 includes one or more drill pipe sections 32, which may be about 30 feet in length. A drilling rig (not shown) is typically connected to a proximal end of the drillstring 30 above ground. In conventional systems, the drilling rig supplies energy for the various devices and/or actuators of the drillstring 30 that are positioned downhole. For example, drilling fluid or mud is commonly pumped downhole at very high pressures by the drilling rig. The drilling fluid is siphoned off by the actuators 38 and/or devices 40 along the drillstring and converted into other forms of energy that power the actuators 38 and/or devices 40 to perform various functions downhole, such as rotary motion, prismatic motion, and the like. Most of the downhole devices and/or actuators are passive mechanical systems that are designed to perform only one or a few functions.

The drillstring 30 includes one or more actuation control systems 38 (hereinafter actuation control systems 38 or actuator 38) that control the movement and/or operation of one or more actuatable components or devices (40 and/or 36) positioned distally or proximally of the actuation control system 38. For example, the actuatable device 40 may comprise a drill bit having its angular velocity and/or torque controlled by the actuation control system 38.

In embodiments where the actuation control system 38 is a servo-controlled device, the device may be powered from above surface or downhole as desired. For example, to power electro-mechanical systems, such as a servo-controlled actuator 38, a hydraulically controlled generator (e.g., a mud driven electrical generator), and the like, may be positioned downhole and energized via the drilling fluid (i.e., mud) that is pumped downhole from the drilling rig. For example, the generator may siphon off the drilling fluid to generate electrical power that is used by the servo-controlled actuator 38 and/or one or more actuatable devices 40. The power produced by the generator eliminates the need for power to be supplied entirely via a source positioned above ground. In other embodiments, the power for the servo-controlled actuator may be supplied via one or more electrical lines that are positioned downhole and powered above ground.

The drilled hole may form a wellbore. Casing, an embodiment of an oilfield tubular, may form a structural component of the wellbore. Casing may be designed to withstand various forces. For example, casing may prevent a formation wall from caving into the wellbore, may isolate different formations to prevent the flow or crossflow of formation fluid, and may provide a means of maintaining control of formation fluids and pressure as a well is drilled.

In some embodiments, an oilfield tubular may be production tubing. Production tubing may be a conduit in which fluids are produced and transported to the surface. The production tubing may be contacted by moving fluids and may corrode or erode as a result of the fluid properties and/or the movement of the fluid. For example, the corrosion or erosion may be caused in part by frictional, inertial, and/or viscous forces.

Figure 2:
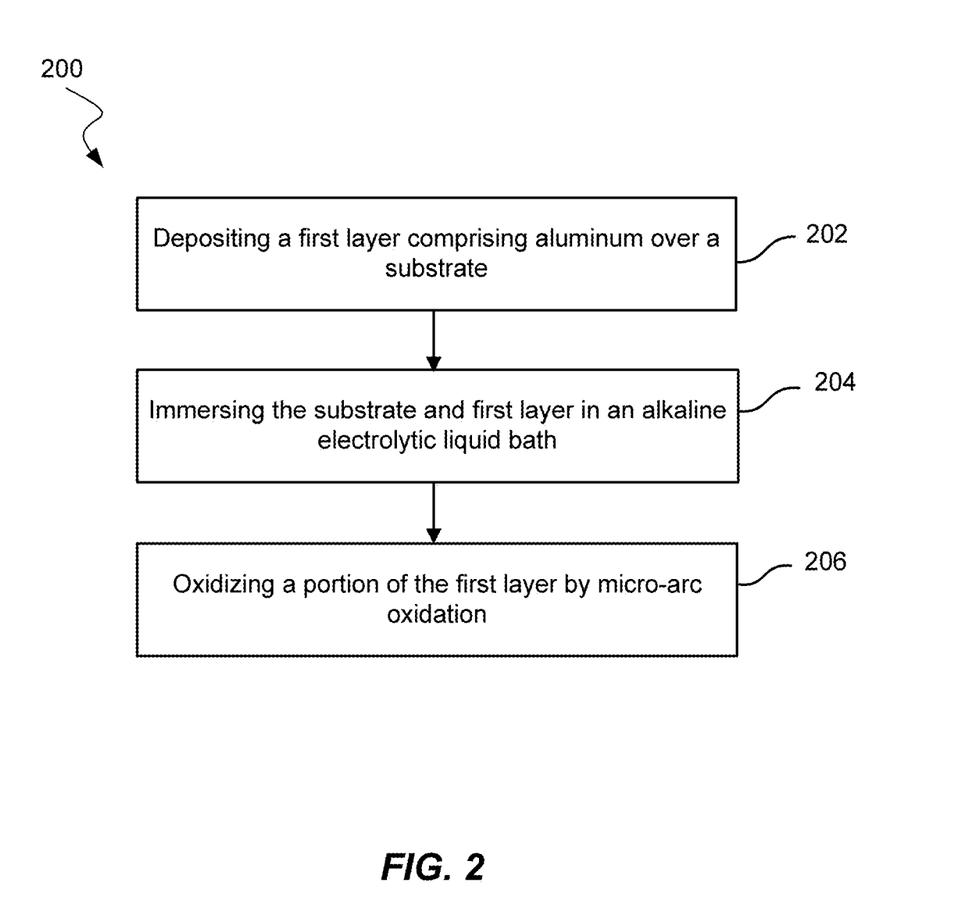
FIG. 2 shows a method of improving tribological and corrosion properties of an oilfield tubular according to embodiments.
Figure 3A:
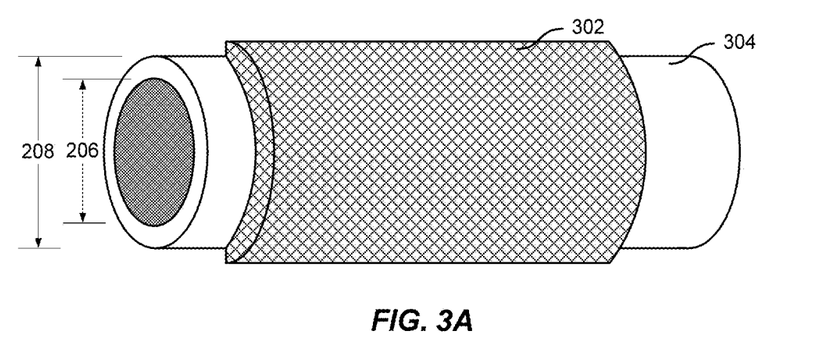
FIGS. 3A, 3B, and 3C show views of layers on a substrate according to embodiments.

FIG. 2 shows a method 200 of improving the tribological and corrosion properties of an oilfield tubular. Method 200 may include depositing a first layer over a substrate 202. The first layer may include aluminum. As shown in FIG. 3A, the first layer may be layer 302 over substrate 304. The first layer may in some embodiments include a metal, metals, or composite metals and alloys as described later in the specification.

The substrate may include ferrous alloys, non-light metals, nickel alloys, copper alloys, titanium alloys, or cobalt alloys. Ferrous alloys may include a steel or a steel alloy. For example, the substrate may include carbon steel, low alloy steel, or stainless steel. In embodiments, ferrous alloys may include terrific steels, austenitic steels, duplex steels, or precipitation-hardened steels. Plain carbon and low alloy steel may include 10xx, 41xx, 86xx, or F22. Stainless steels may include martensitic steels such as 410, 420, or S 13Cr; PH martensitic such as 17-4PH; austenitic such as 316/316L; PH austenitic such as A286; duplex and super duplex stainless steels such as 2205, 2507, or Ferralium 255. The nickel alloy may include a nickel-chromium-molybdenum alloy such as 718, 625plus, 725, 925, 935, 945, or 945X. The copper alloy may include bronze, brass, spinodals such as a nickel-copper alloy such as ToughMet® alloys, or a nickel-copper alloy such as Monel® (including K500) alloys. The cobalt alloy may include a cobalt-chromium-molybdenum alloy such as MP35N and Stellite. The substrate may include or exclude any metal or group of metals.

The substrate may include any material used in any sacrificial anode or degradable metals. Degradable metals may include aluminum alloys, magnesium alloys, or zinc alloys. Sacrificial anodes and degradable metals may protect underlying materials with a hard and corrosion resistant layer and then may break down under certain conditions associated with an event. Degradable metals are described in detail in U.S. Pat. No. 8,663,401, the contents of which are incorporated herein by reference for all purposes.

Exemplary degradable compositions, which may be used as a substrate, may exist in a variety of morphologies (i.e., physical forms on the atomic scale), including 1) a reactive metal or alloy of crystalline, amorphous or mixed crystalline and amorphous structure, and the features characterizing the composition (e.g. grains, phases, inclusions, and the like) may be of micron or submicron scale, for instance nanoscale; 2) powder-metallurgy like structures (e.g. pressed, compacted, sintered) including an inventive composition including at least one relatively reactive metal or alloy combined with other metals, alloys or compositions that preferentially develop large galvanic couples with the reactive metal or elements in the non-intra-galvanic degradable alloy; and 3) composite and hybrid structures comprising one or more reactive metals or alloys as a metal matrix, imbedded with one or more relatively non-reactive materials of macro-to-nanoscopic sizes (e.g. powders, particulates, platelets, flakes, fibers, compounds, and the like) or made for instance from stacks of layers of dissimilar metals, alloys and compositions with the provisos that certain layers are reactive. Compositions include alloy compositions comprising a reactive metal selected from elements in columns I and II of the Periodic Table combined with at least one element (alloying element) that, in combination with the reactive metal, produces a high-strength, controllably reactive and degradable metallic composition having utility as an oilfield element, among other uses.

Exemplary compositions include compositions wherein the reactive metal is selected from calcium, magnesium, aluminum, and wherein the at least one alloying element is selected from lithium, gallium, indium, zinc, bismuth, calcium, magnesium, and aluminum if not already selected as the reactive metal, and optionally a metallic solvent to the alloying element. Another class of compositions within the invention is an entirely novel class of aluminum alloys wherein aluminum is made considerably more reactive than commercially available aluminum and aluminum alloys. To enhance reactivity of aluminum, aluminum is essentially alloyed with gallium, indium, among other elements such as bismuth or tin for example. For commercial applications, including in the oilfield, aluminum is particularly attractive because of its availability worldwide, relatively low cost, high processability (e.g. aluminum can be cast, welded, forged, extruded, machined, and the like), and non-toxicity; thus aluminum and its alloys may be safely handled during fabrication, transportation, and final use of the degradable element. Other compositions are composite or hybrid structures, for instance made from those novel aluminum alloys. A non-restrictive example of these innovative compositions is a metal-matrix composite of these degradable aluminum alloys reinforced by ceramic particulates or fibers, itself coated with one or several other compositions, possibly metallic, ceramic, polymeric.

Degradable compositions include calcium alloys; e.g. calcium-lithium (Ca—Li), calcium-magnesium (Ca—Mg), calcium-aluminum (Ca—Al), calcium-zinc (Ca—Zn), and the like, including more complex compositions like calcium-lithium-zinc (Ca—Li—Zn) alloys without citing their composites and hybrid structures. Other degradable composition embodiments within the invention include magnesium-lithium (Mg—Li) alloys enriched with tin, bismuth or other low-solubility alloying elements, as well as special alloys of aluminum, such as aluminum-gallium (Al—Ga) or aluminum-indium (Al—In), as well as more complex alloying compositions; e.g. aluminum-gallium-indium (Al—Ga—In), aluminum-gallium-bismuth-tin (Al—Ga—Bi—Sn) alloys, and more complex compositions of these alloys.

Depositing the first layer may include different methods of deposition, including a thermal spray process, a cold spray process, a hot dip aluminizing (liquid) process, a vapor aluminizing process, a plasma and ion deposition process, or an electrolytic deposition process.

Thermal spray processes may include flame spray, arc spray, plasma spray, high velocity oxygen fuel (HVOF), high velocity air fuel (HVAF), or detonation gun (D-Gun). Thermal spray processes may be used for inner diameters greater than 3.5 inches if the inner surface is to be coated. Thermal spray processes may be used for any range of outer diameters. Thermal spray processes may also be used for any length of substrate because thermal spray processes may coat a surface sequentially. In other words, a surface may be coated by a thermal spray as the surface moves under the spray to coat an adjacent surface until the entire surface is coated. Thermal spray processes may be fast but may involve spacing between the aluminum feed and the substrate to be coated for proper coverage.

Figure 4:
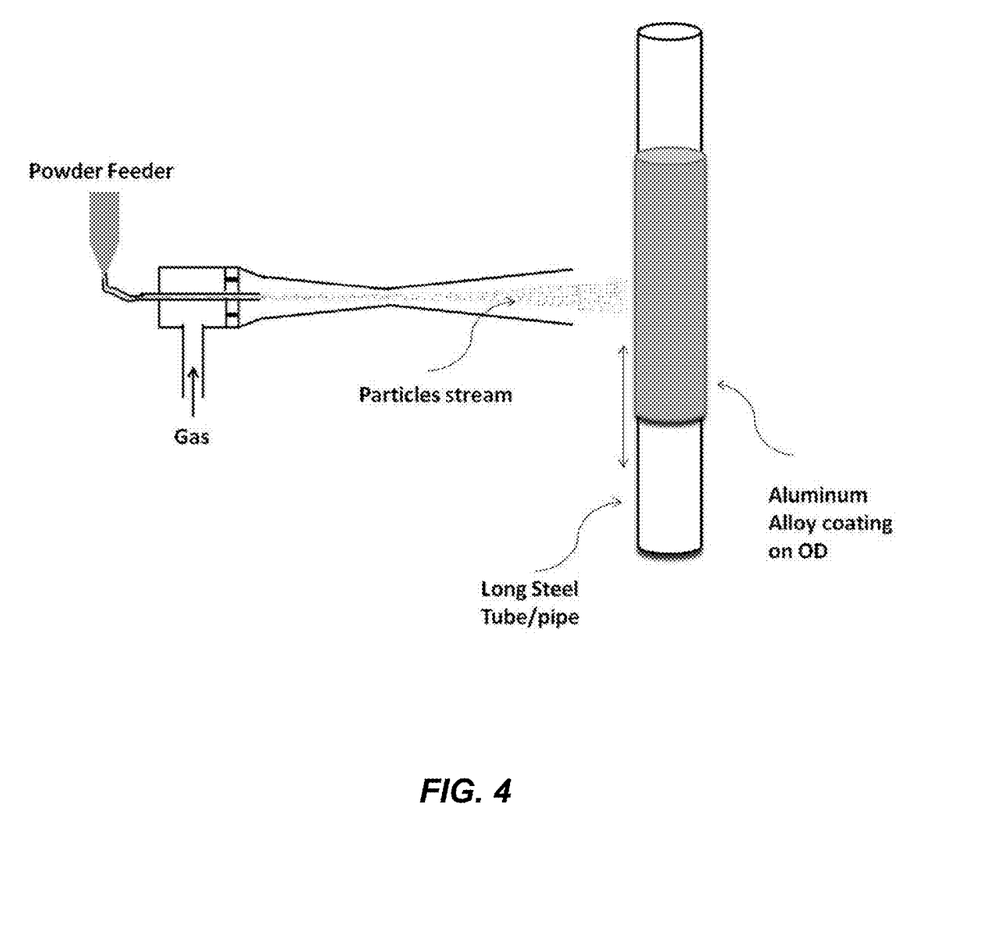
FIG. 4 shows a schematic of a cold spray process.

Cold spray processes may include little or no heat but may include greater velocities than thermal spray processes. FIG. 4 shows an example of a cold spray of a coating 402 on a tubular 404. Tubular 404 is moved across a particle stream 406 in order to coat a desired section of tubular 404. Particle stream 406 is formed from the mixture of powder from a powder feeder 408 and gas 410. The coating may be an aluminum alloy. Similar to thermal spray processes, cold spray processes may be used for inner diameters greater than 3.5 inches if the inner surface is to be coated. Cold spray processes may be used for any value of outer diameter. Additionally, cold spray processes may be used for any length of substrate because cold spray processes may coat a surface sequentially, similar to thermal spray processes. Cold spray processes may be fast but may involve relative displacement between the aluminum feed and the substrate to be coated for proper coverage.

Hot dip aluminizing (liquid) processes may be used to coat inner diameters greater than about 0.25 inches. Because hot dip aluminizing processes typically use a bath, the outer diameters that can be coated and the lengths of tubulars that can be coated are dependent on the bath size. A bath tank may be limited to coating a length of about 25 feet. Of the depositions processes described herein, hot dip aluminizing may be the fastest or one of the fastest. Only the surface of the substrate may reach a high temperature so that not much heating is involved.

Vapor aluminizing processes may be used to coat inner diameters greater than about 0.25 inches. Vapor aluminizing normally involves using a furnace. Accordingly, the limits of the outer diameter and the length of a tubular to be coated may depend on the furnace size. The furnace size may limit coating of a tubular length of about 25 feet or less. Vapor aluminizing typically involves applying significant amounts of heat. The amount of heat applied in vapor aluminizing may affect properties of the tubular substrate and may distort the tubular substrate.

Plasma and ion deposition processes may be used to coat inner diameters greater than about 0.25 inches. Plasma and ion deposition processes may include a chamber, which may limit the tubular outer diameters and lengths to be coated. The chamber size may limit coating to tubulars of lengths shorter than about 6 feet. Plasma and ion deposition processes are generally expensive.

An electrolytic deposition process may include an ionic liquids process. Electrolytic deposition processes may be used to coat inner diameters less than about 12 inches. Because electrolytic deposition processes typically use a bath, the outer diameters that can be coated and the lengths of tubulars that can be coated may depend on the bath size. The outer diameter limits may also depend on the inert atmosphere chamber. Inert atmospheres may include nitrogen gas and/or an atmosphere with a water content of less than 0.1% by weight. In some embodiments, a vacuum chamber may be used in place of an inert atmosphere chamber. A bath tank may be limited to coating a length of about 1 foot. Electrolytic processes may be difficult to scale to coat typical oilfield tubulars or larger substrates.

Method 200 may further include diffusing aluminum atoms into the substrate after depositing the first layer and before oxidizing the first layer. The diffusion treatment may enhance the bonding and other properties of the first layer. The diffusion treatment may depend on the deposition technique, the chemistry of the coating, the chemistry of the substrate, the desired diffusion depth, and/or the geometry of the product. As an example, for aluminum coating deposited using an ionic liquid, a two-step treatment similar to that used in U.S. Patent Publication No. 20120189778. For nickel-based alloys, the layer may first be treated at about 649° C. (1,200° F.) and optionally may subsequently be treated at about 1,079° C. (1,975° F.).

Method 200 may also include immersing the substrate and the first layer in an alkaline electrolytic liquid bath 204. The liquid bath may be in a tank. The size of the tank may be selected based on the size of the tubular or the size of the tubular may be selected based on the size of the tank. The electrolytic liquid bath may have a pH greater than about 7, greater than about 8, greater than about 9, or greater than about 10 in embodiments. Electrolytic liquid baths may include an alkaline solution of sodium or potassium with low concentrations of modifying compounds such as sodium silicate or sodium pyrophosphate.

Method 200 may further include oxidizing a first portion of the first layer by micro arc oxidation 206 to form a second layer over a second portion of the first layer. The first portion may be a top portion of the first layer. The first portion may include the complete first layer. Micro arc oxidation (MAO), also known as plasma electrolytic oxidation (PEO), may oxidize a surface in an electrolytic bath. A positive voltage may be supplied to the surface to be oxidized, and a negative voltage may be supplied to an adjacent surface that is not to be oxidized. In this manner, MAO may not be limited to line-of-sight oxidation. Voltage supplied for 50 Hz bipolar AC may be between about 200 V and about 400 V in the positive half cycle and at −100 V in the negative half cycle. The current density may be pre-set at 100 mA·cm$^{-2}$. The second layer may include aluminum oxide. The second layer may be thicker than 1 μm, 2 μm, 3 μm, 5 μm, 10 μm, 20 μm, 30 μm, or 40 μm in embodiments. The second layer may be up to 50 μm thick in embodiments and may be between any two thicknesses described. The second layer may be an oxide layer that is thicker than a native oxide formed with exposure to typical atmospheric conditions. Native oxide layers on aluminum may be less than 5 nm.

Figure 3B:
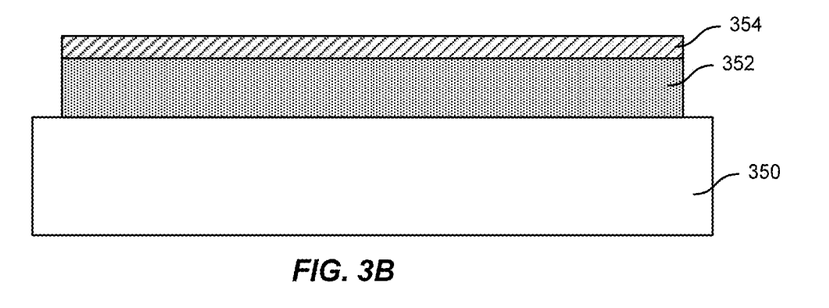

After oxidizing a portion of the first layer, the substrate and layers may be similar to the diagram in FIG. 3B. FIG. 3B shows a substrate 350 with a first layer 352 and a second layer 354. Substrate 350 may be any substrate described herein. First layer 352 may be any layer described herein. Second layer 354 may be any layer described herein, include an oxide layer.

The oilfield tubular may be oxidized in two or more operations. For example, the oilfield tubular may be longer than the electrolytic liquid bath. A fraction of the oilfield tubular may be oxidized first, forming an oxide layer in a portion of the first layer. Then the remaining fraction may be oxidized second, forming an oxide layer in the remaining portion of the first layer. The oxide layer may be aluminum oxide. For example, the tank holding the alkaline electrolytic liquid bath may be about half the length of the tubular. The tank may hold half the tubular while using seals to prevent the liquid bath from leaking. After half the tubular is oxidized, the other half of the tubular may be moved into the liquid bath and subsequently oxidized. The other half of the tubular may be adjacent to the first half of the tubular.

Method 200 may also include masking a portion of the surface of the first layer before oxidizing. Masking the surface of the first layer may prevent the oxidation of portion of the surface by micro arc oxidation. For example, the method may include masking a threaded portion of an oilfield tubular. All or part of the inner surface may be masked. In some embodiments, all or part of the outer surface may be masked. Additionally, parts of the inner surface and parts of the outer surface may be masked.

Methods may also include embedding particles or nanoparticles into the second layer. Solid lubricant additives, hard nanoparticles, conductive carbon-based materials or other particles may be added to the electrolyte and then mechanically stirred to form a suspension during the MAO process. The solid lubricant particles may remain embedded in the metal oxide matrix. Embedded particles or nanoparticles are discussed in additional detail later in this specification.

The oilfield tubular may include the substrate, the first layer, and the second layer. The oilfield tubular may include any oilfield tubular described herein. Additionally, methods may include methods of making other oilfield products, including a flow diverter, a tubing string test (TST) valve, a piston, a gear, a rotary pump, or a sub-surface ball valve. Furthermore, the method may include methods of making electrical parts, including multi-pin bulkhead connectors, which may require adequate electrical insulation.

The second layer may define pores. The method may further include depositing a third layer onto the second layer. The third layer may be deposited over the second layer by chemical vapor deposition or by physical vapor deposition. A portion of the third layer may fill in a portion of the pores and may reduce the size of the pores or eliminate the pores completely. In this or similar manners, the third layer may be described as impregnating the second layer.

Figure 3C:
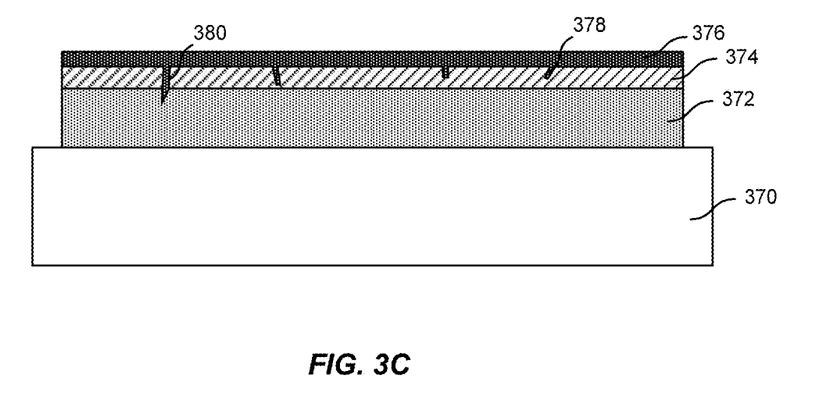

FIG. 3C illustrates one possible manner of impregnation. A substrate 370 has a first layer 372, a second layer 374, and a third layer 376. A pore 378 may exist in second layer 374 and may be filled by third layer 376. In addition to pore 378, which exists entirely in second layer 374, a pore 380 that extends from second layer 374 into first layer 372 may also be present and may be filled by third layer 376. The substrates and layers may be any substrates and layers described herein.

The third layer may be deposited to improve tribological properties (i.e., wear properties) of the tubular product. One way to improve tribological properties may include liquid lubrication. A lubricating oil or grease may impregnate the second layer. The resulting tubular product may have a low friction coefficient. The third layer may include solid lubricants, such as graphite, PTFE, MoS$_2$, or WS$_2$. Impregnation of a lubricant into the second layer may help to improve tribological properties.

The third layer may include a polymer or an epoxy. The third layer may include a melted polymer during deposition of the third layer. The tubular product may be preheated in a kiln. A polymer may be melted to evenly spread over the second layer and fill in pores and asperities. This third layer may then be exposed to air to crystallize the polymer layer.

The third layer may not just lubricate the tubular product. The third layer may have a high strength, high resistance to impact/cracking, high anti-friction properties, high wear resistance, high corrosion resistance, high electrical resistance, high electrical conductivity, high thermal shock resistance, and/or stable mechanical properties over a wide temperature range. Strength may refer to a load bearing property, including increasing resistance to collapse or improving burst rating under axial loads. Examples of third layers may include epoxy phenolics, polyphenylene sulfide (PPS) (Ryton®), or polytetrafluoroethylene (PTFE)-based fillers mixed with MoS$_2$.

In some embodiments, the third layer may form a triplex coating to combine the advantages of the MAO layer, which has a high load-bearing capacity, with an additional coating, which may have a low friction coefficient. For instance, the third layer may include triplex coatings such as TiN, CrN, or diamond like coating (DLC) deposited on MAO aluminum oxide.

Some embodiments may include a tubular product for oilfield applications. The tubular product may include a tubular substrate. The tubular substrate may include steel or steel alloy. The tubular substrate may have an inner surface characterized by an inner diameter and an outer surface characterized by an outer diameter. The inner surface may be defined as the surface closer to the center of a circular cross section of the tubular substrate. FIG. 3A shows an inner diameter 306 of substrate 304, and an outer diameter 308 of substrate 204. The inner diameter may be greater than or equal to about 0.25 inch, about 3.5 inches, 6 inches, about 12 inches, about 18 inches, or about 25 inches in embodiments. The inner diameter may range between any two inner diameters listed. The outer diameter may be greater than or equal to about 1 inch, about 2 inches, about 4 inches, about 7 inches, about 8 inches, about 12 inches, about 14 inches, or about 20 inches. The thickness of the wall of the tubular may be between 0.25 inch and 3 inches, including, for example, 0.5 inch, 1 inch, and 2 inches. The tubular product may have a length. The length may be less than or equal to about 40 feet, 30 feet, 25 feet, about 18 feet, about 12 feet, about 10 feet, about 6 feet, about 5 feet, about 1 foot, or about 6 inches according to embodiments. In FIG. 3A, layer 302 does not extend across the full length of substrate 304. In some embodiments, layer 302 may extend across the full length or substantially the full length of substrate 304.

The tubular product may also include a first layer deposited over at least one of the inner surface or the outer surface. The first layer may include aluminum or any material described in the specification. The first layer may be deposited over the inner surface. In some embodiments, the first layer may be deposited over the outer surface. Additionally, the first layer may be deposited over both the inner surface and the outer surface. The inner surface and the outer surface may be coated by the same layer or layers or by a different layer or layers. The inner surface of a tubular product may contact different materials than the outer surface of the tubular product. For example, the inner surface may contact liquid and/or gaseous hydrocarbons (include those from crude oil), while the outer surface may contact solid materials, water, saline water, or non-crude oil materials.

The tubular product may further include a second layer, which may include aluminum oxide formed by micro arc oxidation of a portion of the first layer. Particles or nanoparticles may be embedded in the second layer. Particles or nanoparticles may include carbon-based nano-material. Particles or nanoparticles may include solid lubricant additives, such as graphite, PTFE, $MoS_2$, or $WS_2$. The particles or nanoparticles may include $H_2S$ sensing materials. $H_2S$ sensing materials may include CuO—$SnO_2$ Core/Shell PN-Junction nanorods, CuO modified $SnO_2$ nanoribbons (thermal oxidation followed by mixing with CuO powders), CuO doped $SnO_2$ nanowires (by thermal evaporation), $WO_3$ nanoparticle, ZnO nanorods, or other similar materials. Embedded particles or nanoparticles may develop coatings with improved hardness and wear resistance. The particles or nanoparticles may include tungsten carbide (WC), silicon carbide (SiC), boron carbide ($B_4C$), silicon nitride ($Si_3N_4$), aluminum nitride (AlN), cubic boron nitride (BN), or other similar materials. Particles or nanoparticles may include conductive carbon-based materials, which may be embedded in the metal oxide matrix to form composite coatings with high electrical conductivity. Conductive carbon-based materials include a carbon nanotube (CNT), graphene nano platelet, reduced graphene oxide, or other similar material. High electrical conductivity coatings may be applied to an aluminum-based electrical housing, such as an electrical chassis.

The tubular product may have greater corrosion resistance than a tubular substrate without the first layer and the second layer. One end of the tubular substrate may be threaded. The outer surface of the tubular substrate may be threaded to fasten the tubular substrate to the inner surface of another tubular substrate or an intermediate connector part. Alternatively, the inner surface of the tubular substrate may be threaded to fasten the tubular substrate to the outer surface of another tubular substrate or an intermediate connector part. One end of the tubular substrate may be threaded on the same or different surface than the other end of the tubular substrate. The threaded end of the substrate may or may not have a layer deposited on it, or if a layer is deposited on the threaded end, the layer may or may not be oxidized.

In some embodiments, the tubular product may include coil tubing, a drill pipe, a rise pipe, a subsea part, an artificial-lift pump housing, or a subsea tree. Products of the present technology may also include any product described herein, with the layers of the tubular product described herein.

Figure 5:
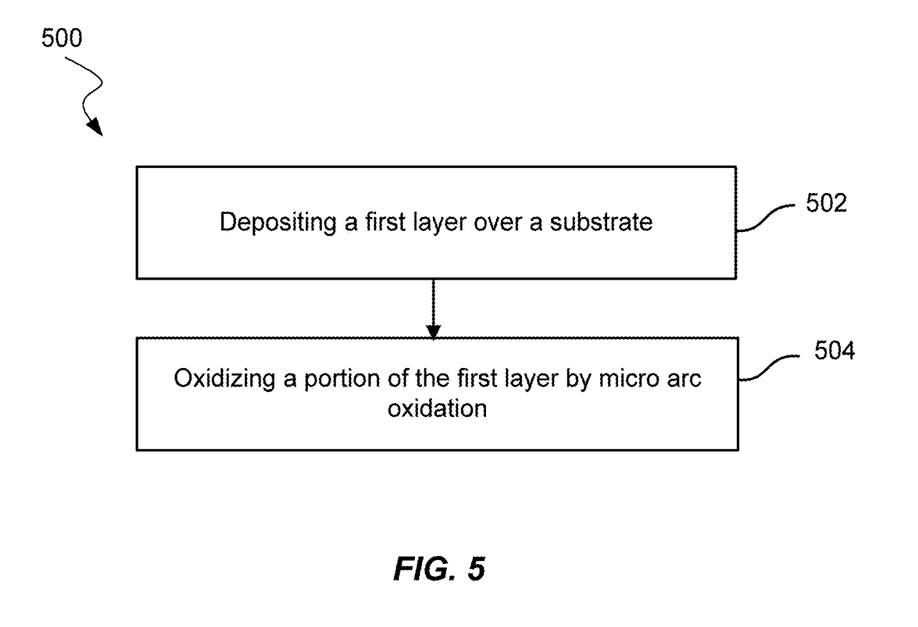
FIG. 5 shows a method of making a product for oilfield applications according to embodiments.

As shown in FIG. 5, embodiments may include a method 500 of making a product for oilfield applications. Method 500 may include depositing a first layer over a substrate 502. The substrate may include a first material. The first material may include ferrous alloy, nickel alloy, copper alloy, or a cobalt alloy. The first material may be any metal or alloy described herein.

In addition, the first layer may include a second material. The second material may include aluminum, magnesium, titanium, mixtures thereof, or a composite metal or alloy that includes aluminum and magnesium. The composite metal or alloy may include up to 90% aluminum on a molar basis and 10% magnesium on a molar basis. Other molar ratios may include up to 80% Al, 20% Mg; 70% Al, 30% Mg; 60% Al, 40% Mg; 50% Al, 50% Mg; 40% Al, 60% Mg; 30% Al, 70% Mg; 20% Al, 80% Mg; or 10% Al, 90% Mg. Molar ratios may be between any two of the ratios. The composite metal or alloy may aluminum and titanium. Molar ratios may include up to 90% Al, 10% Ti; 80% Al, 20% Ti; 70% Al, 30% Ti; 60% Al, 40% Ti; 50% Al, 50% Ti; 40% Al, 60% Ti; 30% Al, 70% Ti; 20% Al, 80% Ti; or 10% Al, 90% Ti. Molar ratios may be between any two of the ratios. The second material may also include aluminum, magnesium, or titanium in combination with transition metal elements. Transition metal elements include, but are not limited to, Sc, Y, La, V, Mo, Nb, Pd, Ru, and Rh. Sc, Y, and/or La may be included in combination with an aluminum and/or magnesium first layer. V, Mo, Nb, Pd, Ru, and/or Rh may be included in combination with a titanium first layer.

The composite metal may include aluminum, magnesium, and silicon. The molar ratio of the aluminum, magnesium, and silicon may be chosen from a phase diagram to select a glassy or near glassy coating. Alternatively, a molar ratio could be chosen to produce a porous coating, which could include pores that could be filled with nanoparticles or another material.

In some embodiments, the alloy may include aluminum, magnesium, and titanium. In these and other embodiments, the alloy may include aluminum, magnesium, and at least one of nickel, molybdenum, or copper. The composite metal or alloy may be chosen so that the metal may react with a corrosive environment without substantially degrading. For example, the corrosive environment may include $H_2S$. The $H_2S$ may react with nickel, molybdenum, or copper to form $NiS_2$, $MoS_2$, or $Cu_2S$, which have mechanical properties that may maintain the integrity of coating without leading to corrosion of the underlying substrate.

Method 500 may further include oxidizing a first portion of the first layer by micro arc oxidation 504 to form a second layer over a second portion of the first layer. The first portion of the first layer may be the entirety of the first layer. Also, the first portion of the first layer may be the top portion of the first layer. The second layer may include an oxide of the second material.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Additionally, details of any specific embodiment may not always be present in variations of that embodiment or may be added to other embodiments.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither, or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the tubular" includes reference to one or more tubulars and equivalents thereof known to those skilled in the art, and so forth. The invention has now been described in detail for the purposes of clarity and understanding. However, it will be appreciated that certain changes and modifications may be practice within the scope of the appended claims.

What is claimed is:

1. A tubular product for oilfield applications, the tubular product comprising:
a tubular substrate comprising a ferrous alloy, wherein the tubular substrate has an inner surface characterized by an inner diameter and an outer surface characterized by an outer diameter;
a first layer deposited directly onto at least one of the inner surface or the outer surface of the tubular substrate, wherein the first layer comprises aluminum;
a second layer being between 1 µm and 40 µm thick and comprising aluminum oxide formed by micro arc oxidation of a portion of the first layer, wherein the second layer comprises an amount of aluminum oxide that is stoichiometrically equivalent to an amount of aluminum oxidized in the first layer, and wherein the second layer defines a plurality of pores, including at least one pore extending into the first layer; and
a third layer filling the plurality of pores in the second layer, wherein the portion of the at least one pore in the first layer is filled with the third layer.

2. The tubular product of claim 1, wherein nanoparticles are embedded in the second layer.

3. The tubular product of claim 2, wherein the nanoparticles include a material selected from the group consisting of tungsten carbide, silicon carbide, boron carbide, silicon nitride, aluminum nitride, cubic boron nitride, a carbon nanotube (CNT), graphene nano platelet, and reduced graphene oxide.

4. The tubular product of claim 2, wherein the nanoparticles comprise a $H_2S$ sensing material.

5. A tubular product for oilfield applications, the tubular product, comprising:
a tubular substrate comprising a ferrous alloy, wherein the tubular substrate has an inner surface characterized by an inner diameter and an outer surface characterized by an outer diameter;
a first layer deposited directly onto at least one of the inner surface or the outer surface of the tubular substrate, wherein the first layer comprises aluminum;
a second layer being between 1 µm and 50 µm thick and comprising aluminum oxide formed by micro arc oxidation of a portion of the first layer, wherein the second layer comprises an amount of aluminum oxide that is stoichiometrically equivalent to an amount of aluminum oxidized in the first layer, and wherein nanoparticles are embedded in the second layer, the nanoparticles comprising a $H_2S$ sensing material comprising $CuO$—$SnO_2$ Core/Shell PN-Junction nanorods, CuO modified $SnO_2$ nanoribbons, CuO doped $SnO_2$ nanowires, $WO_3$ nanoparticle, or ZnO nanorods.

6. The tubular product of claim 2, wherein the tubular product has greater corrosion resistance than the tubular substrate without the first layer and the second layer.

7. The tubular product of claim 1, wherein the inner diameter is greater than or equal to about 0.25 inches and less than or equal to about 6 inches.

8. The tubular product of claim 1, wherein the tubular product is characterized by a length, and the length is between about 18 feet and about 25 feet.

9. An oilfield tubular comprising:
a substrate comprising a ferrous alloy;
a first layer directly on a surface of the substrate, wherein the first layer comprises aluminum deposited by a thermal spray process, a cold spray process, a hot dip aluminizing (liquid) process, a vapor aluminizing process, a plasma and ion deposition process, or an electrolytic deposition process; and
a second layer over a second portion of the first layer, wherein the second layer is between 1 µm and 40 µm thick and comprises aluminum oxide, and wherein the second layer is formed by oxidizing a first portion of the first layer by micro arc oxidation, wherein the second layer comprises an amount of aluminum oxide that is stoichiometrically equivalent to an amount of aluminum oxidized in the first layer, and wherein the second layer defines a plurality of pores, including at least one pore extending into the first layer; and
a third layer filling the plurality of pores in the second layer, wherein the portion of the at least one pore in the first layer is filled with the third layer.

10. The oilfield tubular of claim 9, wherein formation of the second layer includes immersing the substrate and the first layer in an alkaline electrolytic liquid bath.

11. The tubular product of claim 1, wherein the second layer is between 1 µm and 30 µm thick.

12. The tubular product of claim 11, wherein the second layer is between 5 µm and 30 µm thick.

13. The oilfield tubular of claim 9, wherein the second layer is between 1 µm and 30 µm thick.

14. The oilfield tubular of claim 13, wherein the second layer is between 5 µm and 30 µm thick.

15. The tubular product of claim 1, the third layer including a lubricant.

16. The tubular product of claim 15, the lubricant including a solid lubricant that includes one or more of graphite, polytetrafluorethylene, $MoS_2$, or $WS_2$.

17. The tubular product of claim 1, the third layer including a triplex coating.

18. The tubular product of claim 1, the third layer including one or more of epoxy phenolics, polyphenylene sulfide, polytetrafluorethylene, or $MoS_2$.

19. The tubular product of claim 4, the $H_2S$ sensing material comprising $CuO$—$SnO_2$ Core/Shell PN-Junction nanorods, CuO modified $SnO_2$ nanoribbons, CuO doped $SnO_2$ nanowires, $WO_3$ nanoparticle, or ZnO nanorods.

* * * * *